(12) United States Patent
Botula et al.

(10) Patent No.: US 6,429,489 B1
(45) Date of Patent: Aug. 6, 2002

(54) ELECTROSTATIC DISCHARGE POWER CLAMP CIRCUIT

(75) Inventors: Alan Botula, Essex Junction, VT (US); David TinSun Hui, Poughkeepsie, NY (US); Steven Howard Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/681,667

(22) Filed: May 18, 2001

(51) Int. Cl.[7] .............................................. H01L 23/62
(52) U.S. Cl. ...................................... 257/355; 257/356
(58) Field of Search .................................. 257/335, 356

(56) References Cited

U.S. PATENT DOCUMENTS

| | | | |
|---|---|---|---|
| 3,641,407 A | 2/1972 | Scott | 317/43 |
| 4,461,955 A | 7/1984 | Bezdek | 250/551 |
| 5,091,818 A | 2/1992 | Morikawa et al. | 361/56 |
| 5,150,187 A | 9/1992 | Huang | 357/43 |
| 5,210,675 A | 5/1993 | Palara | 361/91 |
| 5,481,129 A | * | 1/1996 | DeJong et al. |
| 5,521,414 A | 5/1996 | Palara | 257/355 |
| 5,530,612 A | 6/1996 | Maloney | 361/56 |
| 5,568,345 A | 10/1996 | Mudd et al. | 361/56 |
| 5,708,549 A | 1/1998 | Croft | 361/56 |
| 5,748,425 A | 5/1998 | Gutsch et al. | 361/56 |
| 5,774,318 A | 6/1998 | McClure et al. | 361/56 |
| 5,825,603 A | 10/1998 | Parat et al. | 361/111 |
| 5,872,378 A | 2/1999 | Rose et al. | 257/355 |
| 5,986,863 A | 11/1999 | Oh | 361/56 |
| 5,994,755 A | * | 11/1999 | DeJong et al. |
| 6,011,420 A | 1/2000 | Watt et al. | 327/310 |
| 6,028,758 A | 2/2000 | Sharpe-Geisler | 361/111 |

FOREIGN PATENT DOCUMENTS

JP 59135912 1/1983 ........... H03F/3/343

OTHER PUBLICATIONS

Authors: Culican, Gaudenzi, Giulani and Park, Title: Schottky Clamp for Transistor Breakdown TDP, Sep. 1978 pp. 1454–1455.

* cited by examiner

Primary Examiner—Stephen D. Meier
(74) Attorney, Agent, or Firm—Richard A. Henkler

(57) ABSTRACT

A SiGe ESD power clamp in a Darlington type configuration where the trigger device has a collector-to-emitter breakdown voltage (BVCEO) that is lower than that of the clamping device, and a frequency cutoff that is higher than that of the clamping device.

10 Claims, 5 Drawing Sheets

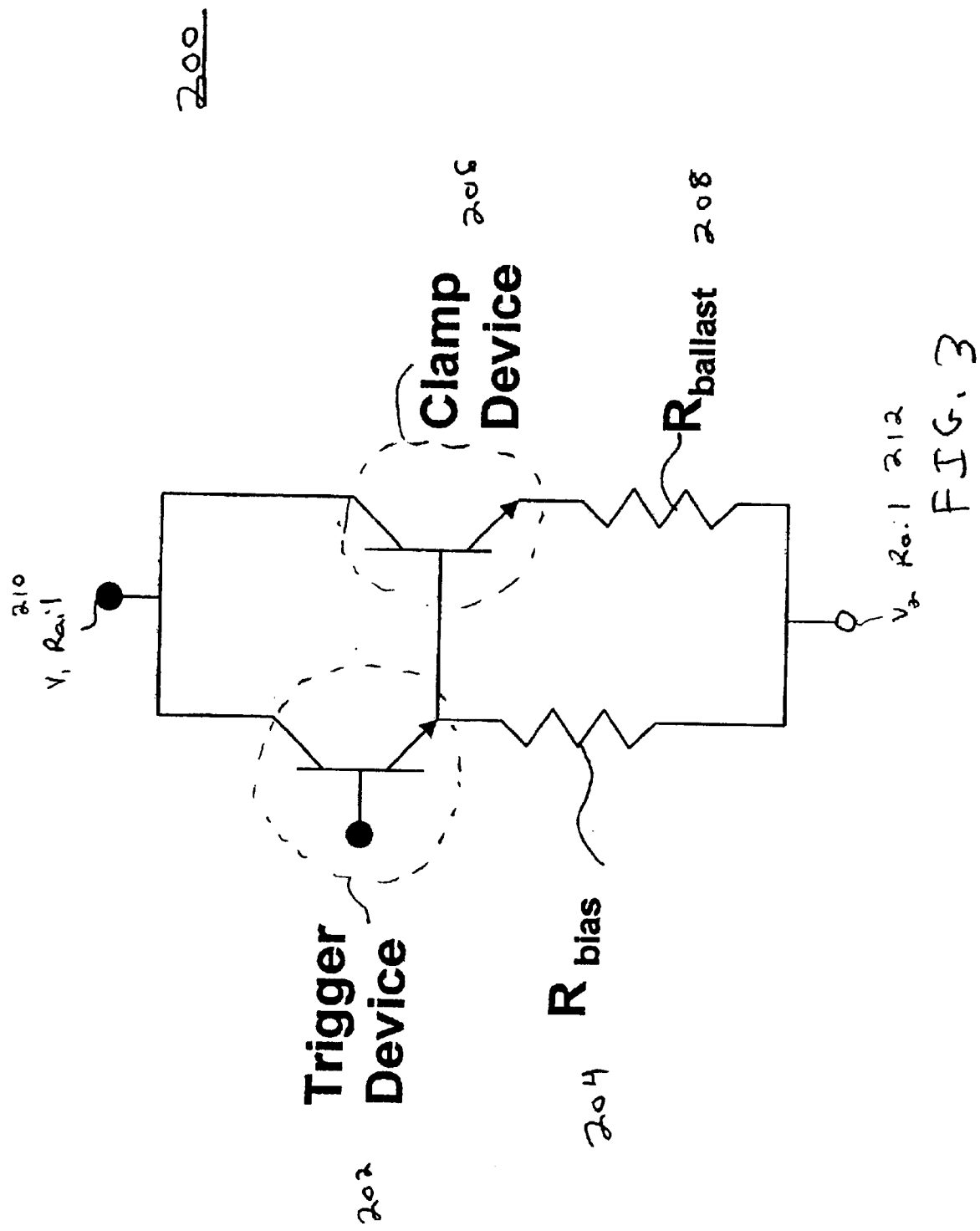

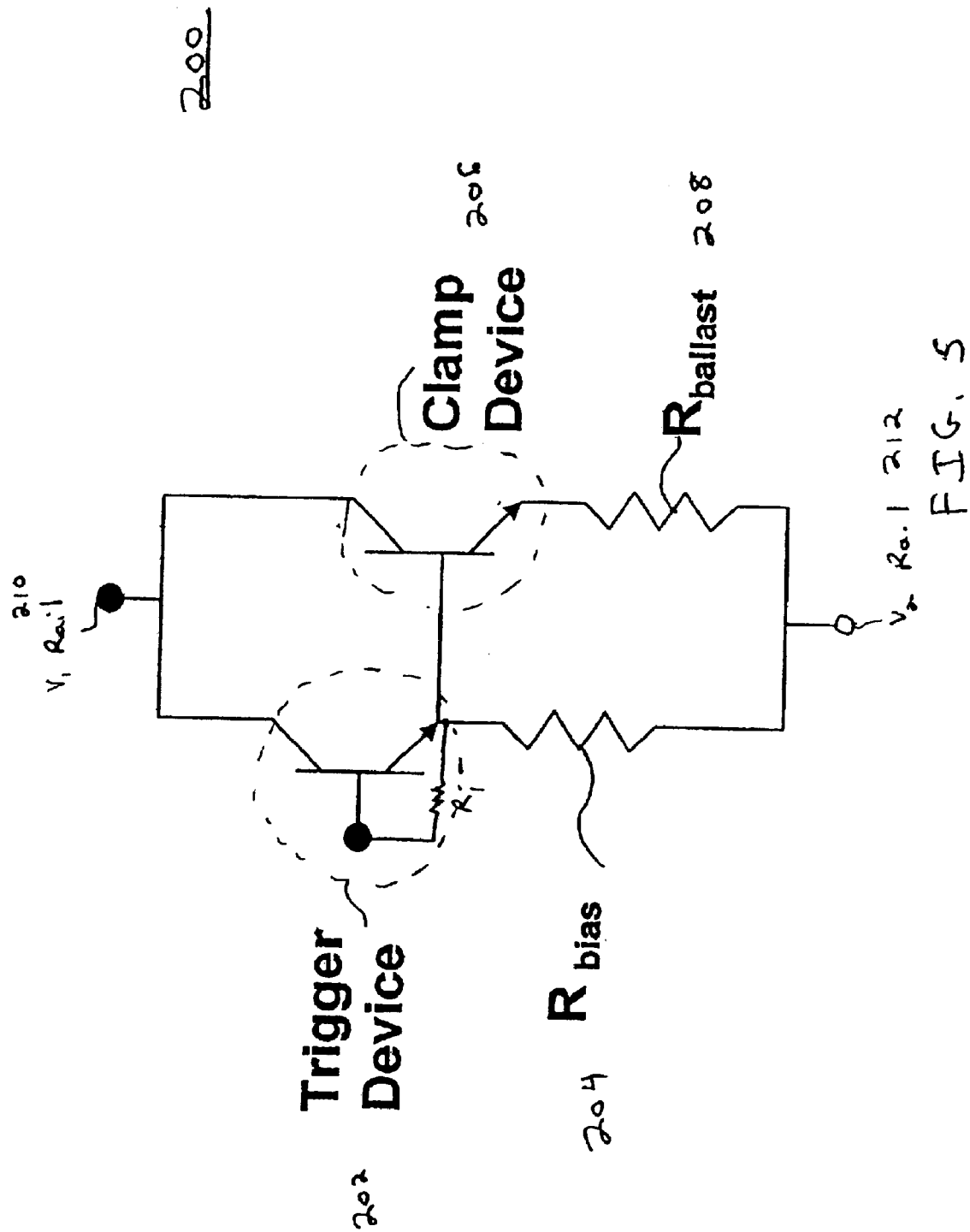

ELECTROSTATIC DISCHARGE POWER CLAMP CIRCUIT

BACKGROUND OF THE INVENTION

1. Technical Field of the Present Invention

The present invention generally relates to electrostatic discharge circuits, and more specifically, to electrostatic discharge power clamp circuits.

2. Background of the Present Invention

Electrostatic Discharge (ESD) events, which can occur both during and after manufacturing of the Integrated Circuit (IC), can cause substantial damage to the IC. ESD events have become particularly troublesome for CMOS and BiCMOS chips because of their low power requirements and extreme sensitivity.

A significant factor contributing to this sensitivity to ESD is that the transistors of the circuits are formed from small regions of N-type materials, P-type materials, and thin gate oxides. When a transistor is exposed to an ESD event, the charge applied may cause an extremely high current flow to occur within the device which can, in turn cause permanent damage to the junctions, neighboring gate oxides, interconnects and/or other physical structures.

Because of this potential damage, on chip ESD protection circuits for CMOS and BiCMOS chips is essential. In general, such protection circuits require a high failure threshold, a small layout size and a low Resistive/Capacitive (RC) delay so as to allow high speed applications.

An ESD event within an IC can be caused by a static discharge occurring at one of the power lines or rails. In an effort to guard the circuit against damage from the static discharge, circuits referred to as ESD clamps are used. An effective ESD clamp will maintain the voltage at the power line to a value which is know to be safe for the operating circuits, and not interfere with the operating circuits under normal operating conditions.

An ESD clamp circuit is typically constructed between a positive power supply (e.g.VDD) and a ground plane, or a ground plane and a negative power supply (VSS). The main purpose of the ESD clamp is to reduce the impedance between the rails VDD and VSS so as to reduce the impedance between the input pad and the VSS rail (i.e. discharge of current between the input to VSS), and to protect the power rails themselves from ESD events.

The never ending demand by the consumer for increased speed in Radio Frequency (RF) devices has resulted in some unique challenges for providing ESD protection in these high speed applications. More specifically, the physical size (e.g. Breakdown voltage) and loading effects of the ESD devices must now be considered in such high speed applications (e.g. 1–200 Giga Hertz range). The capacitive loading of the ESD device itself becomes a major concern for chips running at high frequencies, since the capacitive loading has an adverse effect on performance. For example, the capacitive loading effect of a typical ESD clamp at a frequency of 1 Hz is 0.5 pF, 10 GHz–0.1 pF, and at 100 GHz–0.05pF, 200 Ghz–0.01 pF).

It would, therefore, be a distinct advantage to have an ESD clamp that could provide substantial benefits in high speed devices while limiting any performance degradation from capacitive loading. The present invention provides such an ESD clamp.

BRIEF SUMMARY OF THE INVENTION

The present invention is an ESD device that is useful in high speed radio frequency applications where size and loading effects are a concern. The ESD device is preferably constructed on a SiGe or equivalent type material that nearly approximates the Johnson Limit curve, and constructed in a Darlington type configuration. In the preferred embodiment of the present invention, the trigger device has a collector-to-emitter breakdown voltage (BVCEO) that is lower than that a frequency cutoff that is higher than that of the clamping device.

BRIEF DESCRIPTION OF THE SEVERAL VIEWS OF THE DRAWINGS

The present invention will be better understood and its advantages will become more apparent to those skilled in the art by reference to the following drawings, in conjunction with the accompanying specification, in which.

FIG. 3 is a schematic diagram illustrating a Darlington ESD clamp 200 constructed in accordance with the teachings of the present invention.

FIG. 5 is a circuit diagram of the Darlington ESD clamp of FIG. 2 as modified according to the teachings of the present invention.

DETAILED DESCRIPTION OF THE INVENTION

Detailed Description of the Preferred Embodiment of the Present Invention

In the following description, numerous specific details are set forth, however, it will be obvious to those of ordinary skill in the art that the present invention can be practiced with different details. In other instances, well-known circuits have been shown in block diagram form in order not to obscure the present invention in unnecessary detail.

The present invention capitalizes upon the recognition that the structural and physical characteristics of Silicon Germanium (SiGe) material and other equivalent materials (e.g. Silicon Germanium Carbon 'SiGeC') are ideal for use in an ESD clamp for high speed applications. More specifically, the present invention recognizes that the scaling of the SiGe heterojunction bipolar transistor is driven by both structural changes and the physical limitations of the transistor itself and such recognition's can be used where size and loading effects are important.

An equation $(P_m X_c)^{1/2} f_T = E_m V_s / 2\ddot{\iota}\epsilon$ known as the Johnson Limit describes a fundamental relationship between the frequency response of the transistor and the maximum power applied across the transistor element. P represents the maximum power, $X_c$ is represents the reactance ($X_c = \frac{1}{2} \ddot{\iota} \epsilon f_t^m C_{bc}$), $f_t$ represents the unity current gain cutoff frequency, $E_m$ represents the maximum electric field, and $V_s$ represents the electron saturation velocity. The equation can be manipulated so that is it is expressed in terms of maximum voltage $V_m f_T = E_m v / 2 \ddot{\iota} \epsilon$ to illustrate the inverse relationship between the transistor speed and the allowed breakdown voltage.

Figure 1:
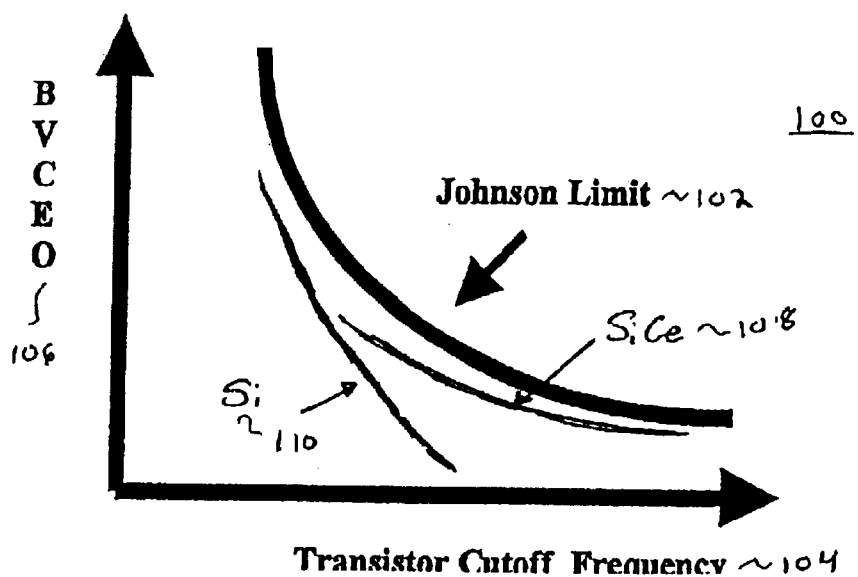
FIG. 1 is a pictorial diagram illustrating in greater detail the Johnson Limit curve.

FIG. 1 is a pictorial diagram 100 illustrating in greater detail the Johnson Limit curve 102 and approximations of how transistors constructed of Silicon and SiGe would compare. In this diagram 100, the x-axis represents $f_T$ and the y-axis represents the Breakdown Voltage of the transistor from the collector-to-emitter (BVCEO). The curve 102 demonstrates that the BVCEO of the transistor decreases with the increase in the unity current gain cutoff frequency ($f_T$). Approximations of how a transistor constructed of Si (Silicon) 110 and SiGe 108 have been transposed on the diagram 100.

Figure 2:
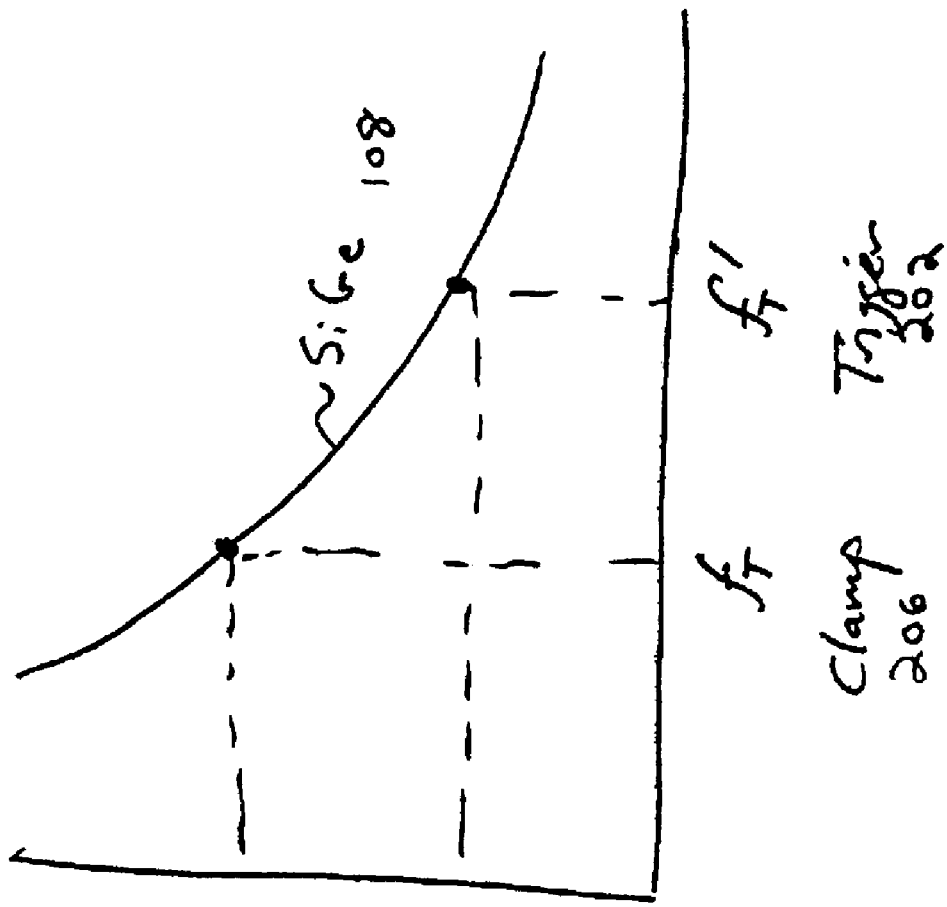
FIG. 2 is a schematic diagram illustrating a Darlington ESD clamp constructed in accordance with the teachings of the present invention.

FIG. 2 is a pictorial diagram illustrating the frequency cutoff and BVCEO characteristics of a trigger and clamp devices constructed in accordance with the teachings of the present invention. As previously discussed and illustrated in FIG. 1, a transistor constructed from SiGe material closely approximates the Johnson Limit curve. The present invention recognizes and capitalizes upon this recognition. More specifically, the present invention uses a first ESD device having a low BVCEO and a high $f_t$ to trigger (Trigger 202) a second ESD device having a $f_t$, that is higher than that of the first ESD device, and a high BVCEO (Clamp 206). In this configuration, the capacitive loading of the ESD power clamp is reduced to a respectable level.

The use of a lower breakdown voltage trigger device ensures the turning on of the trigger element prior to the turn on of the clamp element. This is important because the turning on of the clamp element prevents non-uniform current constriction within the clamp element leading to the lack of ESD robustness with increase scaling of the clamp element length during high frequency applications.

The trigger element also has a higher frequency response compared to the clamp element, making it sensitive to spurious noise spikes and electrostatic emissions (EMI) events. Because of the Johnson limit relationship, the frequency response of the trigger is higher with a lower breakdown voltage.

In the preferred embodiment, the first and second ESD devices are arranged in a Darlington pair configuration as explained in greater detail in connection with FIG. 2.

FIG. 3 is a schematic diagram illustrating a Darlington ESD clamp 200 constructed in accordance with the teachings of the present invention. Specifically, the Darlington ESD clamp 200 is constructed between two power rails V1 210 and V2 212. Power rails V1 and V2 can be, for example, Power and Ground or Ground and negative Power, respectively. The Darlington ESD clamp 200 includes a trigger device (npn SiGe transistor) 202, a clamp device (npn SiGe transistor) 206, bias resistor 204, and ballast resistor 208.

It should be noted that although a single stage Darlington ESD clamp 200 has been illustrated for ease of explanation purposes, the present invention is equally applicable to multiple staged Darlington pairs/stages as well.

Trigger device 202 has a BVCEO that is lower than that of the clamp device 206 and a cutoff frequency that is higher than that of the clamp device 206. During an ESD event, the trigger device 202, upon reaching its BVCEO, will provide base current into the clamp device 206.

Conversely, clamp device 206 has a BVCEO that is higher than that of the trigger device 202, a cutoff frequency that is lower than that of the trigger device 202, and discharges the current from the ESD event from Power rail V1 to V2.

In series with the clamp device 206 is ballast resistor 208. Ballast resistor 208 is used in a conventional fashion for providing emitter stability, voltage limitations, thermal stability, and ESD stability.

In series with trigger device 202 is bias resistor 204. Bias resistor 204 is used for keeping the base of the clamp device 206 to a low potential in order to limit the amount of current that flows through the trigger device 202 during an ESD event.

In the preferred embodiment of the present invention, the trigger device 202 is a SiGe heterojunction bipolar transistor (HBT) formed in the configuration explained in connection with FIG. 3 below.

FIG. 3 is a cross sectional view diagram of an implementation of the trigger device 202 of FIG. 2 as a SiGe HBT according to the teachings of the present invention. The SiGe HBT 202 is formed on a n++ subcollector 302. The SiGe epitaxial film is placed on the silicon surface forming the extrinsic base 304 over the STI isolation and the intrinsic base region 306 over the single crystal silicon region. An n+ pedestal implant 308 is formed through the emitter window.

The pedestal implant is typically formed to reduce the Kirk effect. The Kirk effect is due to the high current density which forces the space charge region of the base-collector junction to get pushed into the collector region reducing the frequency response of the transistor. To prevent this, an extra 'pedestal implant' is placed so as to maintain a high $f_T$ device, which in turn causes a low BVCEO breakdown voltage. Obviously, more pedestal implants can be added to lower the BVCEO until a desired level is obtained.

In the preferred embodiment of the present invention, a first pedestal implant is placed in both the clamp 206 and trigger 202 devices. A second pedestal implant is used through the emitter window to form the high frequency trigger device 202.

Alternative embodiments of both the clamp 206 and trigger 202 devices can be created by adding additional pedestal and/or CMOS N-well implants. For example, table below illustrates how such implants could be used to create three distinct transistors each of which have a differing $f_T$.

| Transistor $f_T$ | Implants |
| --- | --- |
| Low | First pedestal only |
| Medium | First pedestal and N-Well |
| High | First and second pedestals |

From the above table it can be seen that a low $f_T$ device is created by implanting a single pedestal, a medium (with respect to the low and high devices) $f_T$ device by implanting a single pedestal and a N-Well implant from CMOS technology into the collector region, and a high $f_T$ device by implanting two pedestals.

Figure 6:
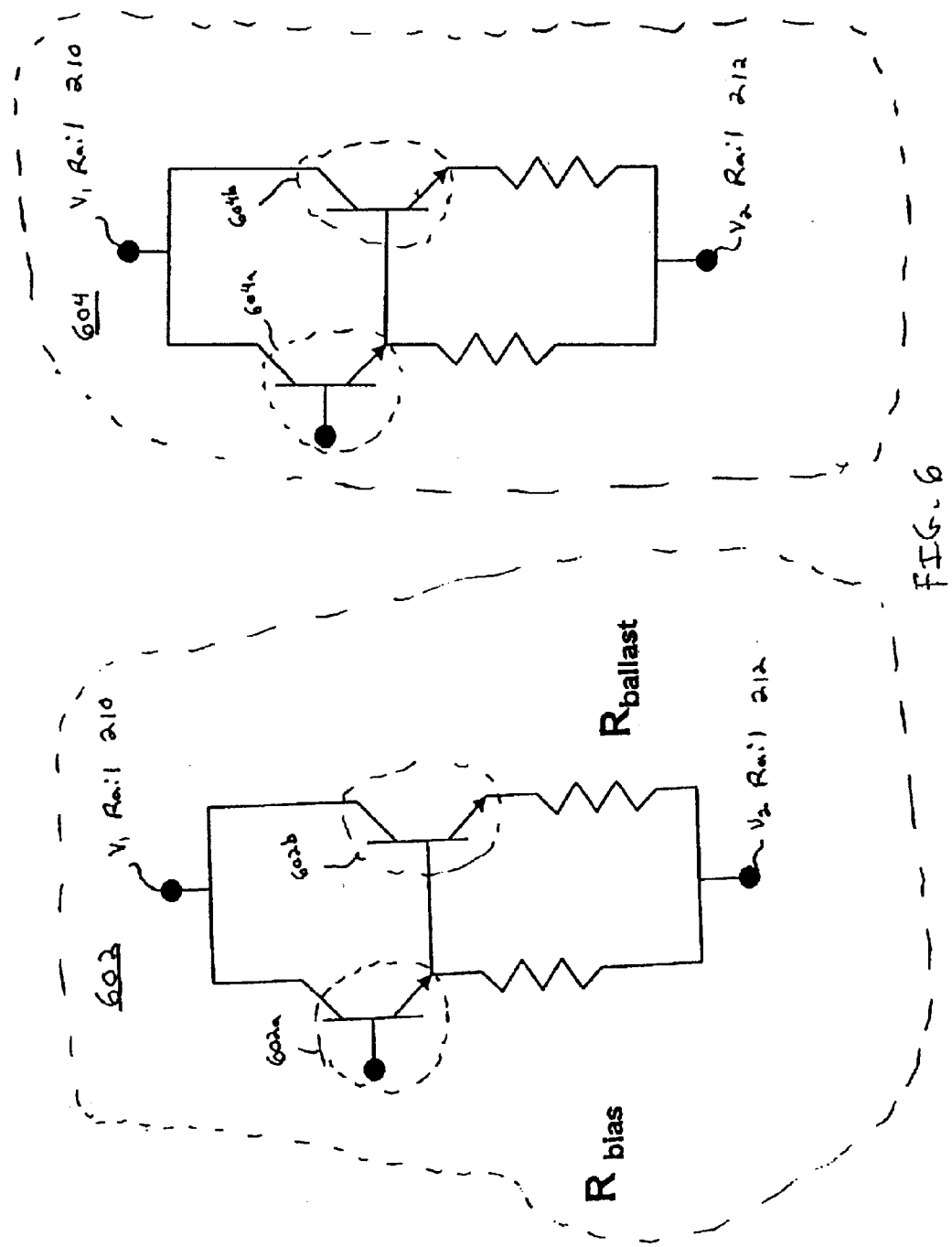
FIG. 6 is a schematic diagram of a dual stage darlington ESD clamp according to the teachings of the present invention.

As previously stated, the present invention is equally applicable to multi-staged Darlington ESD clamps. FIG. 6 and its accompanying description further illustrate such applicability.

FIG. 6 is a schematic diagram of a dual stage darlington ESD clamp according to the teachings of the present invention. First ESD clamp 602 is constructed from a high $f_T$ trigger device 602a coupled to a medium $f_T$ clamp device 602b. The second ESD clamp 604 is constructed from a medium $f_T$ trigger device 604a, having its base coupled to the emitter of the clamp device 602b, and its emitter coupled to the base of a low $f_T$ clamp device 604b.

Figure 4:
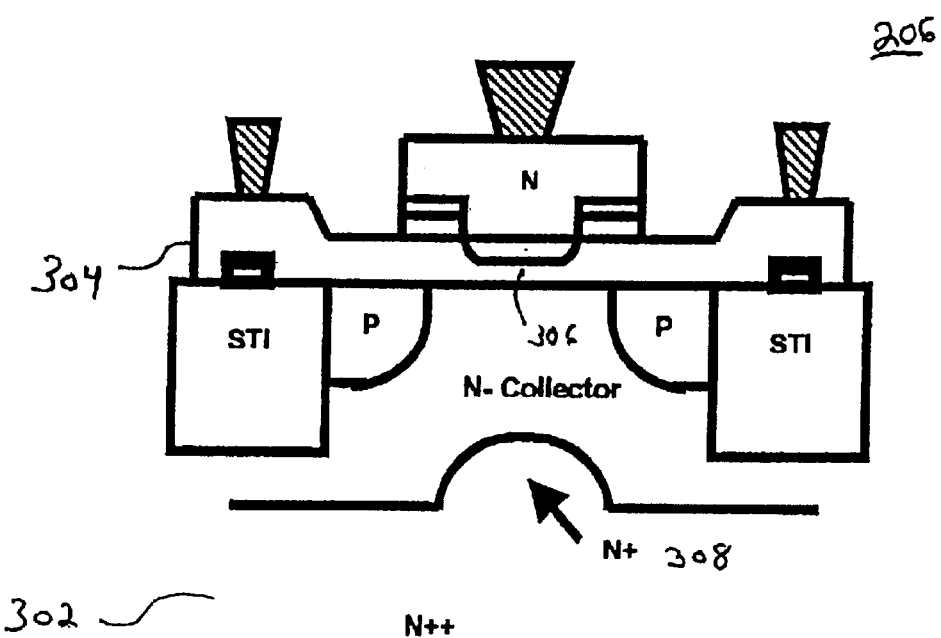
FIG. 4 is a cross sectional view diagram of an implementation of the trigger device of the clamp of FIG. 2 as a SiGe Heterojunction Bipolar Transistor (HBT) according to the teachings of the present invention.

FIG. 4 is a circuit diagram of the Darlington ESD clamp 200 of FIG. 2 as modified according to the teachings of the present invention. The Darlington ESD Clamp 200 of FIG. 2 has been modified to include a resistor R1 coupled between the base and emitter of the trigger device 202. Resistor R1 provides changes the turn on characteristics of the trigger device 202 so that during Direct Current (DC) operation it is not activated by spurious signals.

From the above description it should be apparent to one skilled in the art that the present invention is applicable to high frequency devices where a trigger device triggers an ESD clamp, regardless of the particular configuration. The construction of the trigger and clamp devices can vary depending on the particular application, provided the trigger device has a BVCEO that is lower than the BVCEO of the clamping device, and a frequency cutoff that is higher than that of the clamping device. For example, if a high BVCEO is desired then this can be accomplished by having no pedestal or CMOS N-well structures in the transistor. If a medium BVCEO is desired then this can be accomplished by creating pedestal and/or CMOS N-well structures in the transistor. If a low BVCEO is desired, then this can be accomplished by implanting one or more pedestals and/or multiple CMOS N-well structures into the transistor.

Alternative embodiments

In another embodiment, the trigger device 202 of either FIGS. 3 or 5 can be constructed with Silicon Germanium in the base region forming a SiGe heterojunction bipolar transistor (HBT). The clamp device 206 can be a silicon bipolar junction transistor (BJT). In this embodiment, the trigger device 202 will have a lower breakdown voltage and higher frequency threshold than the clamp device 206.

In yet another embodiment, both the trigger 202 and clamp 206 devices are SiGe HBT devices. The trigger device 202 has been constructed with the pedestal implant as discussed in connection with FIG. 4.

In a further embodiment, both the trigger 202 and clamp 206 devices are SiGe HBT devices. The trigger device 202 has been constructed with a plurality of pedestal implants as discussed in connection with FIG. 4, or alternatively a plurality of CMOS n-well implants could be added to the collector region to provide a high frequency threshold device.

In yet another embodiment, the trigger device 202 can be a SiGeC HBT where the base region contains both Germanium and Carbon to provide a high frequency threshold and a low BVCEO. The clamp device 206 is a SiGe HBT.

It is thus believed that the operation and construction of the present invention will be apparent from the foregoing description. While the method and system shown and described has been characterized as being preferred, it will be readily apparent that various changes and/or modifications could be made wherein without departing from the spirit and scope of the present invention as defined in the following claims.

What is claimed is:

1. An electrostatic discharge device comprising:
   a first transistor; and
   a second transistor coupled to the first transistor so that the activation of the first transistor activates the second transistor, the second transistor having a frequency cutoff that is higher than that of the first transistor and a breakdown voltage that is lower than that of the first transistor.

2. The electrostatic discharge device of claim 1 wherein the first and second transistor are in a darlington pair configuration.

3. The electrostatic discharge device of claim 2 wherein the first and second transistors are constructed of a silicon germanium material.

4. The electrostatic discharge device of claim 3 wherein the first and second transistors are coupled between a power source and ground.

5. The electrostatic discharge device of claim 1 wherein the first and second transistor are in a darlington pair configuration.

6. The electrostatic discharge device of claim 5 wherein the first and second transistors are coupled between a first power source and a second power source.

7. The electrostatic discharge device of claim 6 wherein the first and second transistor are constructed of a silicon germanium material.

8. A semiconductor device comprising:
   a first rail for providing a first voltage source;
   a second rail for providing a second voltage source;
   functional circuitry, coupled between the first and second rails, for performing a desired function;
   electrostatic discharge circuitry, coupled between the first and second rails, for diverting electrostatic discharges from the functional circuitry onto either the first or second rail, the electrostatic discharge circuitry including:
   a first transistor; and
   a second transistor coupled to the first transistor so that the activation of the first transistor activates the second transistor, the second transistor having a frequency cutoff that is higher than that of the first transistor and a breakdown voltage that is lower than that of the first transistor.

9. The semiconductor device of claim 8 wherein the first and second transistor are in a darlington pair configuration.

10. The semiconductor device of claim 9 wherein the first and second transistors are constructed of a silicon germanium material.

* * * * *